United States Patent
Lindholm et al.

(10) Patent No.: US 6,553,523 B1
(45) Date of Patent: Apr. 22, 2003

(54) SYSTEM AND METHOD FOR VERIFYING CONFIGURATION OF A PROGRAMMABLE LOGIC DEVICE

(76) Inventors: Jeffrey V. Lindholm, 1900 Hayward Pl., Longmont, CO (US) 80501; Chakravarthy K. Allamsetty, 1775 Millmont Dr., #E107, Milpitas, CA (US) 95035

(*) Notice: Subject to any disclaimer, the term of this patent is extended or adjusted under 35 U.S.C. 154(b) by 0 days.

(21) Appl. No.: 09/374,251

(22) Filed: Aug. 13, 1999

(51) Int. Cl.[7] .............................................. G01R 31/28
(52) U.S. Cl. ..................... 714/725; 326/38; 714/719; 714/724
(58) Field of Search ................. 326/38, 39; 703/14; 709/203; 712/36; 714/735, 719, 724, 725; 365/201

(56) References Cited

U.S. PATENT DOCUMENTS

| | | | | |
|---|---|---|---|---|
| 5,457,408 A | * | 10/1995 | Leung | 326/38 |
| 5,752,006 A | * | 5/1998 | Baxter | 703/14 |
| 5,892,961 A | * | 4/1999 | Trimberger | 326/39 |
| 6,363,517 B1 | * | 3/2002 | Levi et al. | 709/203 |

OTHER PUBLICATIONS

The Programmable Logic Data Book, 1998, published by and available from Xilinx, Inc., 2001 Logic Drive, San Jose, CA 95124.

* cited by examiner

*Primary Examiner*—Albert Decady
*Assistant Examiner*—Mujtaba Chaudry
(74) *Attorney, Agent, or Firm*—LeRoy D. Maunu, Esq.; Edel M. Young

(57) ABSTRACT

A system and method utilize bitmaps for verifying configuration of a programmable logic device (PLD). A configuration bitstream containing configuration commands and data is converted to a configuration bitmap. The configuration bitstream is downloaded to PLD, thus programming the PLD. Readback commands and data read back from the PLD are used to generate a readback bitstream. The readback bitstream is then converted to a readback bitmap. Bits at corresponding cell locations in the readback bitmap and the configuration bitmap are compared. An error signal is output if the bits are different. In one embodiment, a mask bitmap is generated to indicate which cell locations are non-configuration memory cells and thus need not be compared.

14 Claims, 3 Drawing Sheets

SYSTEM AND METHOD FOR VERIFYING CONFIGURATION OF A PROGRAMMABLE LOGIC DEVICE

FIELD OF THE INVENTION

The present invention generally relates to verifying the configuration of a programmable logic device, and more particularly to verifying the configuration of a programmable logic device in which the configuration bitstream includes both commands and data.

BACKGROUND OF THE INVENTION

An example programmable logic device (PLD) is the field programmable gate array (FPGA), first introduced by Xilinx, Inc. (Xilinx) in 1985. PLDs such as FPGAs are becoming increasingly popular for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability. The capabilities of and specifications for Xilinx FPGAs are set forth in "The Programmable Logic Data Book", published in 1998 by Xilinx.

Where once a typical FPGA design comprised perhaps 5,000 gates, FPGA designs with 50,000 gates are now common, and FPGAs supporting over 300,000 gates are presently available. New challenges for configuring PLDs and verifying proper configuration have accompanied the growth in programmable logic resources in PLDs.

New systems have been developed to reduce the time required to program large FPGAs. Whereas configuration bitstreams of prior systems generally had a one-to-one correspondence between bits in the bitstream and programmable elements in the FPGA, newer systems use configuration bitstreams that include commands and data. Configuration bitstreams with commands and data generally have fewer bits than prior configuration bitstreams, and therefore reduce programming time by having fewer bits to download to the FPGA. For example, a single command and accompanying data can be used to write the same data to multiple memory cells in the FPGA. Command-based configuration bitstreams are described in detail in U.S. Pat. No. 5,892,961, issued Apr. 6, 1999 and entitled "A Field Programmable Gate Array Having Programmable Instructions in the Configuration Bitstream" as well as in U.S. Pat. No. 6,204,687, filed on Aug. 13, 1999, issued on Mar. 20, 2001, and entitled "Method and Structure for Configuring FPGAS" both references being incorporated by reference herein.

Command-based configuration bitstreams generally reduce the time required to configure an FPGA. However, because the configuration bitstream includes both commands and data, whereas the data read back from the FPGA only includes data (i.e., states of the configuration memory cells, user memory, and storage elements such as flip-flops and latches), a one-to-one comparison of bits of the readback data to bits of the configuration bitstream will not indicate whether the configuration is proper. Therefore, the complications arising from verification of proper configuration of an FPGA via a command-based configuration bitstream may offset the programming advantages.

Additionally, verification of all data may be unnecessary as many values in the non-configuration memory locations change during operation. Thus, having a system and method for distinguishing between data types and specifically verifying the configuration of the configuration memory cells is desirable.

Therefore, a need arises for a system and method to address the above issues.

SUMMARY OF THE INVENTION

The present invention provides a method and system for verifying proper configuration of a programmable logic device (PLD). The present invention is implemented using a host data processing system (the host) coupled to an interface device, which in turn is coupled to the PLD. The host converts the configuration bitstream containing configuration commands and data to a configuration bitmap. The host uses the interface device to download the configuration bitstream to the PLD, thereby configuring the PLD. Once configured, the host commands the interface device to read back data from the PLD. The host creates a readback bitmap from the readback data and the associated commands. The host also generates a mask bitmap that identifies the bits in both the configuration bitmap and the readback bitmap to ignore or mask during the configuration verification process. Note that in accordance with the present application, each location in one bitmap has a corresponding location in the other bitmaps.

To confirm proper configuration, the host determines whether a particular bit is masked by using the mask bitmap. If that bit is not masked, then the host compares the bit in the readback bitmap to the corresponding bit in the configuration bitmap. The host provides an error signal if these bit values are different. The host evaluates the proper configuration of all non-masked bits in the bitmaps. In another embodiment, all bits, including masked bits, are evaluated, thereby eliminating the need for generating a mask bitmap.

BRIEF DESCRIPTION OF THE DRAWINGS

Various aspects and advantages of the invention will become apparent upon review of the following detailed description and upon reference to the drawings in which.

DETAILED DESCRIPTION OF THE INVENTION

Figure 1:
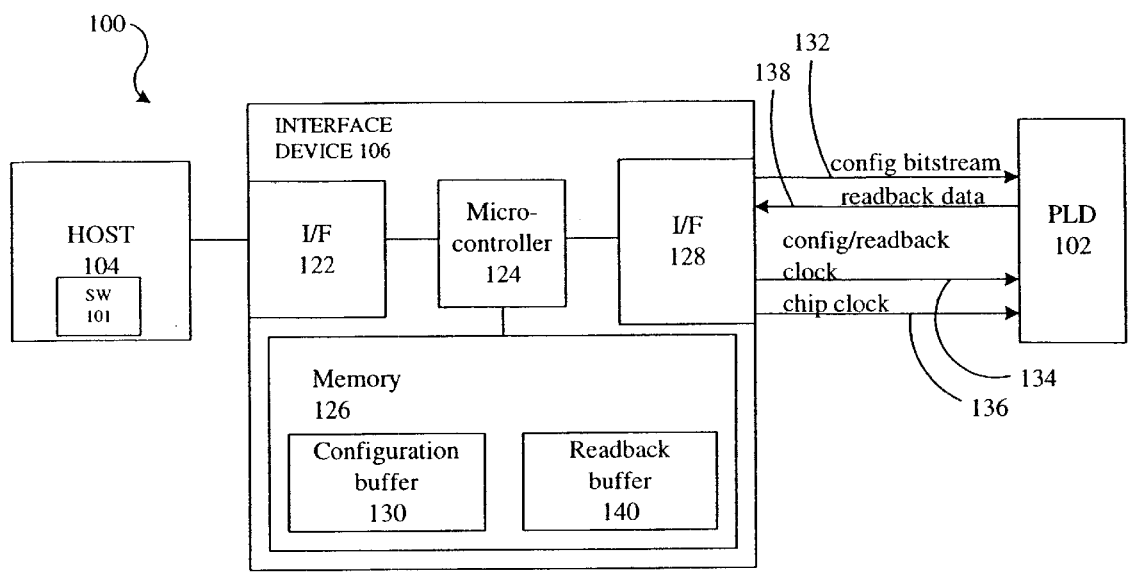
FIG. 1 is a block diagram of one system for configuring and testing a programmable logic device (PLD)

FIG. 1 illustrates a system 100 for configuring and testing the configuration of a programmable logic device (PLD) 102. System 100 includes a host data processing unit (host) 104 which generates a command-based configuration bitstream using software (SW) 101. In one embodiment, software 101 is the M2.1i software from Xilinx. In typical embodiments, host 104 is a workstation or personal computer.

System 100 also includes an interface device 106 which includes a host interface 122, a microcontroller 124, a memory 126, and a PLD interface 128. Note that the particular attributes of PLD interface 128 depend on the particular PLD 102, whereas host interface 122 is generally either a USB interface or an RS232 interface, for example. In one embodiment, interface device 106 is a MultiLINX™ cable sold by Xilinx.

Microcontroller 124 directs the operations of interface device 106 in response to control signals issued from host 104. In accordance with the present invention, microcontroller 124 temporarily stores the configuration bitstream (generated by host 104 and provided via host interface 122) in configuration buffer 130 of memory 126. Microcontroller 124 then functionally interacts with the programming logic (not shown) in PLD 102 to download the configuration bitstream from buffer 130 to PLD 102 via line 132. This bitstream is clocked by the configuration clock signal-on line 134. The chip clock signal on line 136 is provided for sequencing the testing of the configured PLD 102.

In response to commands from software 101 on host 104, microcontroller 124 reads back the configuration data (readback data) from PLD 102 via line 138, clocks the data using a readback clock signal on line 134, and temporarily stores the readback data in readback buffer 140 of memory 126. Microcontroller 124 then uploads the readback data to host 104.

Figure 2:
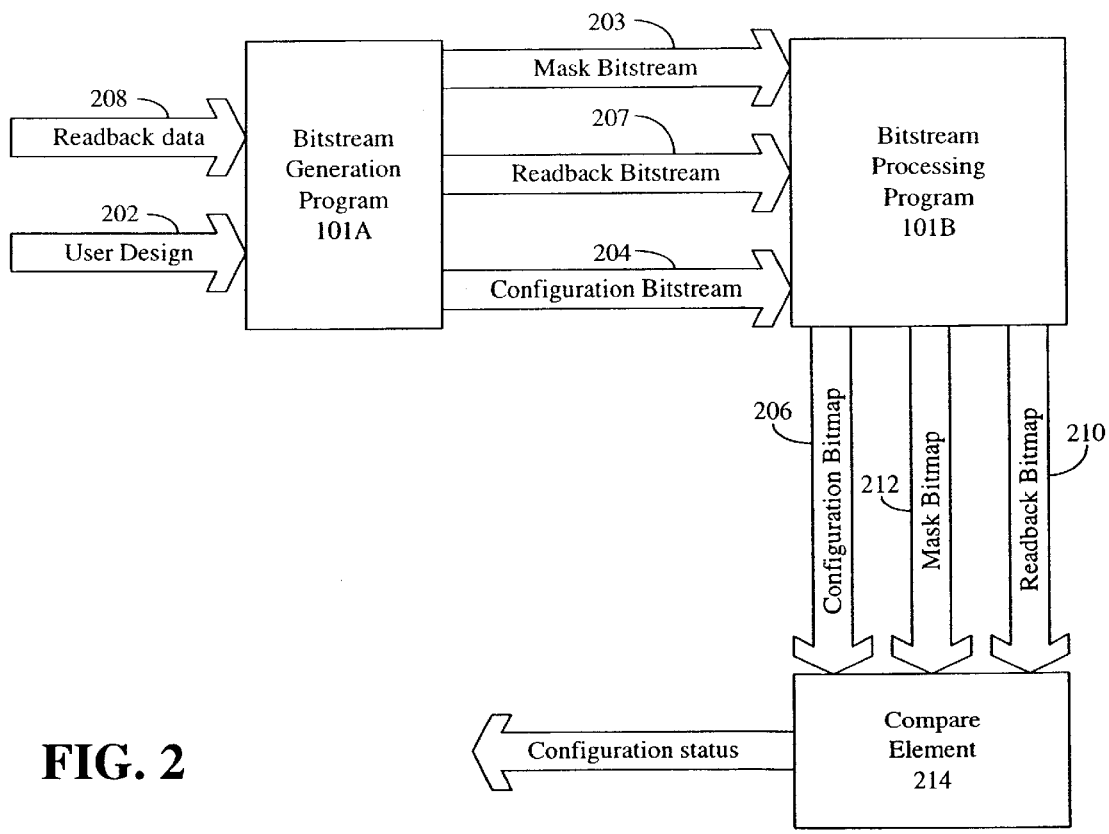
FIG. 2 is a data flow diagram showing the relationship between the configuration, readback, and mask bitstreams, and the configuration, readback, and mask bitmaps.

In accordance with the present invention and referring to FIGS. 1 and 2, software 101 includes, among other programs, bitstream generation program 101A and bitstream processing program 101B. Bitstream generation program 101A receives a user design 202 as well as readback data 208. Using this information, bitstream generation program 101A generates a mask bitstream 203, a readback bitstream 207, and a configuration bitstream 204. Bitstream processing program 101B receives those bitstreams and generates a configuration bitmap 206 from configuration bitstream 204, a readback bitmap 210 from the readback bitstream 207, and a mask bitmap 212 from a mask bitstream 203.

Each bitmap, has an identical m×n array of cells, wherein the coordinates of cells in the bitmaps correspond to the programmable resources of PLD 102. The coordinates of cells in mask bitmap 210 indicate which bits in configuration bitmap 206 and readback bitmap 210 can be ignored for the purpose of verifying a proper configuration.

Mask bitstream 203 is a replica, in part, of configuration bitstream 204. Specifically, mask bitstream 203 includes the commands that are also in configuration bitstream 204. However, mask bitstream 203 substitutes the configuration data in configuration bitstream 204 with mask bits of a predetermined state. For example, configuration bitstream 204 may include commands for storing data in storage elements such as blocks of RAM, and the mask bitstream generated therefrom includes the commands, but has the data values for the blocks of RAM set to logic level 1.

The following example illustrates a partial configuration bitstream and the corresponding partial mask bitstream. The commands and data are written in italicized pseudo-code with comments in parentheses following the commands.

Configuration Bitstream:
  (Section 1)
  Dummy word
  Sync word
  Write 1 word to CMD Register (Command Register)
  RCRC command (Data to the above command)
  Write 1 word to FLR (Frame Length Register)
  FrameLength (Data to the above command)
  Write 1 word to FAR (Frame Address Register)
  Address (Data for the above command—Configuration Frames address)
  Write 51975 words to FDRI (Frame Data Register Input)
  Data word 0
  Data word 1
  Data word 51975
  . . .
  (Section 2)
  Write 1 word to FAR
  Address (Data for the above command—Block RAM0 address)
  Data word 0
  Data word 1
  . . .
  Data word 1365
  (Section 3)
  Write 1 word to FAR
  Address (Data for the above command—Block RAM1 address)
  Write 1365 words to FDRI
  Data word 0
  Data word 1
  . . .
  Startup commands (to activate the design)
Mask Bitstream:
  (Section 1)
  Dummy word
  Sync word
  Write 1 word to CMD Register (Command Register)
  RCRC command (Data to the above command)
  Write 1 word to FLR (Frame Length Register)
  FrameLength (Data to the above command)
  Write 1 word to FAR (Frame Address Register)
  Address (Data for the above command—Configuration Frames address)
  Write 51975 words to FDRI (Frame Data Register Input)
  Data word 0 (the bits in the data words are set to
  logic level 0 to indicate to not mask the readback data)
  Data word 1
  . . .
  Data word 51975
  . . .
  (Section 2)
  Write 1 word to FAR
  Address (Data for the above command—Block RAM0 address)
  Write 1365 words to FDRI
  Data word 0 (each bit in these 32 bits is a "1", as we mask out all RAM information
  Data word 1
  Data word 1365
  . . .
  (Section 3)
  Write 1 word to FAR
  Address (Data for the above command—Block RAM1 address)
  Write 1365 words to FDRI
  Data word 0 (each bit in these 32 bits is a "1", as we mask out all RAM information Data word 1
...
Startup commands (to activate the design)

The example configuration bitstream includes a first section for writing 51975 words to an addressed frame of the PLD (RCRC command and 51975 data words), a second section for writing 1365 words to the addressed block RAM0 (address that specifies the block RAM0), and a third section for writing 1365 words to the addressed block RAM1 (address that specifies the block RAM1). The mask bitstream includes command sections that correspond to the command sections in the configuration bitstream, but the data portions of the mask bitstream include mask bits having predetermined states that indicate whether the corresponding readback data should be masked out.

For example, the first section in the mask bitstream has the same commands and addresses as the configuration bitstream. In this section, the data words of the mask bitstream have bits set to logic level 0, thereby indicating that the bits at those locations in the configuration and readback bitmaps are not to be masked in the configuration verification process. The second and third sections in the mask bitstream also have the same commands and addresses as in the corresponding sections of the configuration bitstream, however, the data words have bits set to logic level 1, thereby indicating that the bits at those locations in the configuration and readback bitmaps are to be masked in the configuration verification. In one embodiment, all cells designated by software 101 as non-configuration memory are masked.

According to the present invention, bitstream generation program 101A prefixes the commands that were downloaded to PLD 102 (to initiate readback) to readback data 208, thereby creating readback bitstream 207. Prefixing readback commands to the readback data may be necessary for PLDs which support addressing the PLD for reading back data. For example, the following sequence of commands and data may be input to the PLD prior to readback.

dummy word
synchronization word
write 1 word to frame address register
configurable logic block frame address (argument to preceding command)
write 1 word to command register (command)
RCFG command (data for the preceding (command)
read 51,975 words from frame data register output: and clock the PLD 51,975 times and readback data The preceding sequence of readback commands and arguments addresses a portion of the PLD from which data is read back. Thus, in order to construct a readback bitmap, the location within the PLD from which the data is readback must be known when the readback data appears. Thus, prefixing the readback commands to the readback data is necessary to determine the proper coordinates within the readback bitmap for the readback data.

Finally, in the present invention, compare element 214 compares the bits of configuration bitmap 206 and readback bitmap 210. In one embodiment, compare element 214 confirms that a particular bit is a configuration memory cell by using mask bitmap 212 before comparing the bits of configuration bitmap 206 and readback bitmap 210. Compare element 214 outputs a status report of the configuration verification process.

Figure 3:
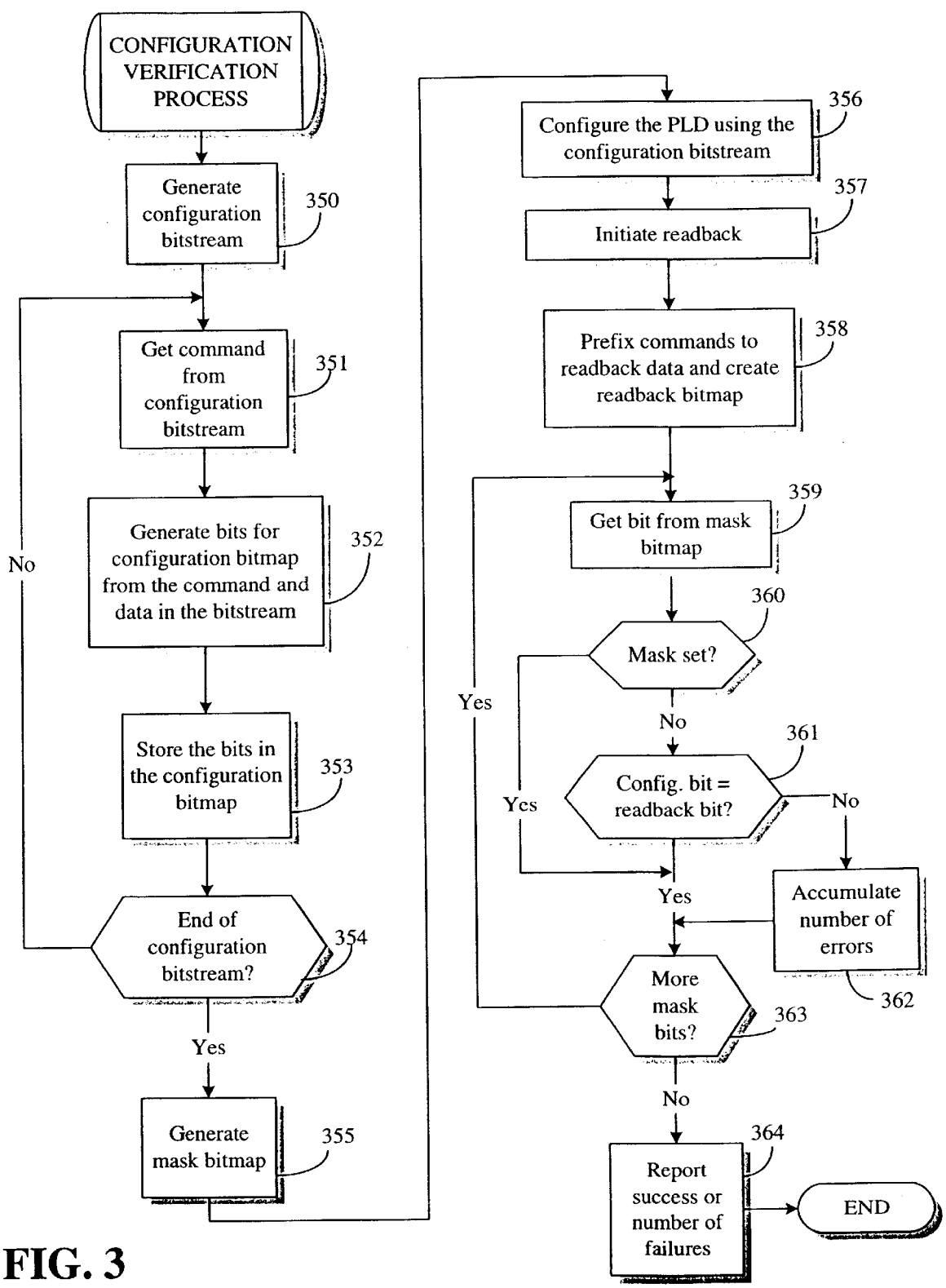
FIG. 3 is a flowchart illustrating one embodiment for verifying proper configuration of a PLD.

FIG. 3 is a flowchart of an example process for verifying proper configuration of a PLD. At step 350, a configuration bitstream is generated. As explained above, this configuration bitstream includes both commands and data for programming the PLD.

Steps 351–354 create a configuration bitmap from the configuration bitstream. Specifically, in step 351, a command is read from the configuration bitstream. In step 352, a collection of bits is created for the configuration bitmap, based on that command and further data read from the configuration bitstream. In other words, step 352 inherently includes interpreting the specific command read in step 351. Thus, the collection of bits generated and the particular positions of those bits in the bitmap depend on the particular command and the data that follows.

For example, configuration bitstreams for Xilinx FPGAs include commands that write configuration data to memory cells within addressable frames of the PLD. Thus, the configuration bitstream might include a command to write data to the frames of the PLD, which is followed by the length of a frame to be written, a frame address at which to begin writing configuration data, and the configuration data to be written to the memory cells.

The configuration verification process interprets each command type in the configuration bitstream and generates the appropriate bits for positions in the configuration bitmap that are associated with the programmable resources in the PLD. Note that the particular commands and programming data will be dictated by the particular PLD. That is, different PLDs will have different programming commands and different programmable resources, and the resulting configuration bitmaps will be different.

At step 353, bits are stored in the configuration bitmap at the locations that correspond to the programmable resources of the PLD. Decision step 354 detects if the end of the configuration bitstream is reached, and returns control to step 351 as long as there is more of the configuration bitstream to process.

The mask bitmap, created at step 355, includes bits that indicate which of the positions in the bitmaps to ignore for purposes of verifying the configuration. It will be apreciated that the mask bitmap can be created by repeating steps similar to steps 351–354, but using the mask bitstream instead of the configuration bitstream. At step 356, the PLD is configured in a conventional manner using the configuration bitstream.

A readback operation is initiated at step 357 to readback data from the PLD. During this initiation step, a host provides commands to the PLD. At step 358, the commands that were downloaded to the PLD to initiate the readback are prefixed to the readback data. Both the readback commands and readback data, which comprise the readback bitstream, are used to generate the readback bitmap (using a process similar to steps 351–354). Therefore, the readback commands are interpreted to determine the locations in the readback bitmap where the readback data is to be written.

At step 359, a bit is obtained from the mask bitmap. If the mask bit is not set to a predetermined state (indicating non-masking), then decision step 360 directs control to decision step 361 to compare the corresponding bits of the configuration bitmap and readback bitmap. If the mask bit is set to the predetermined state (indicating masking), then comparison of the corresponding bits of the configuration bitmap and readback bitmap is not required, and decision step 361 is skipped.

If the bit in the configuration bitmap is equal to the bit in the readback bitmap as determined by step 361, then control is directed to step 363 to determine whether there are more bits in the mask bitmap to process. Otherwise, control is directed to step 362 to increment the number of errors detected.

When all the bits in the mask bitmap have been processed, step 364 reports the status of the configuration verification process. If no errors were detected, then a message is output that indicates a successful configuration. If one or more errors were detected, then, in one embodiment, the number of errors is output in a message indicating that the configuration was not correct.

Figure 4:
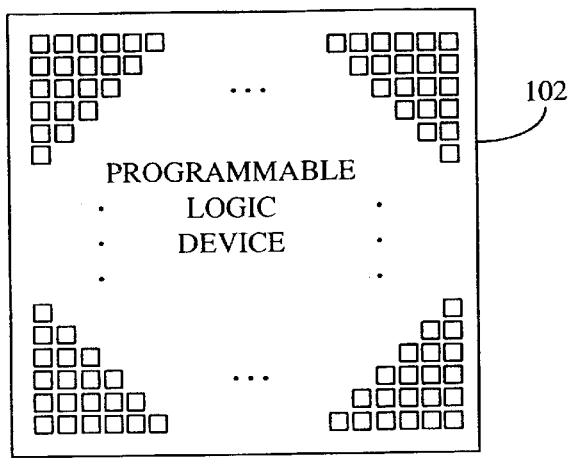
FIG. 4 is a block diagram of the programmable resources of a PLD.
Figure 5:
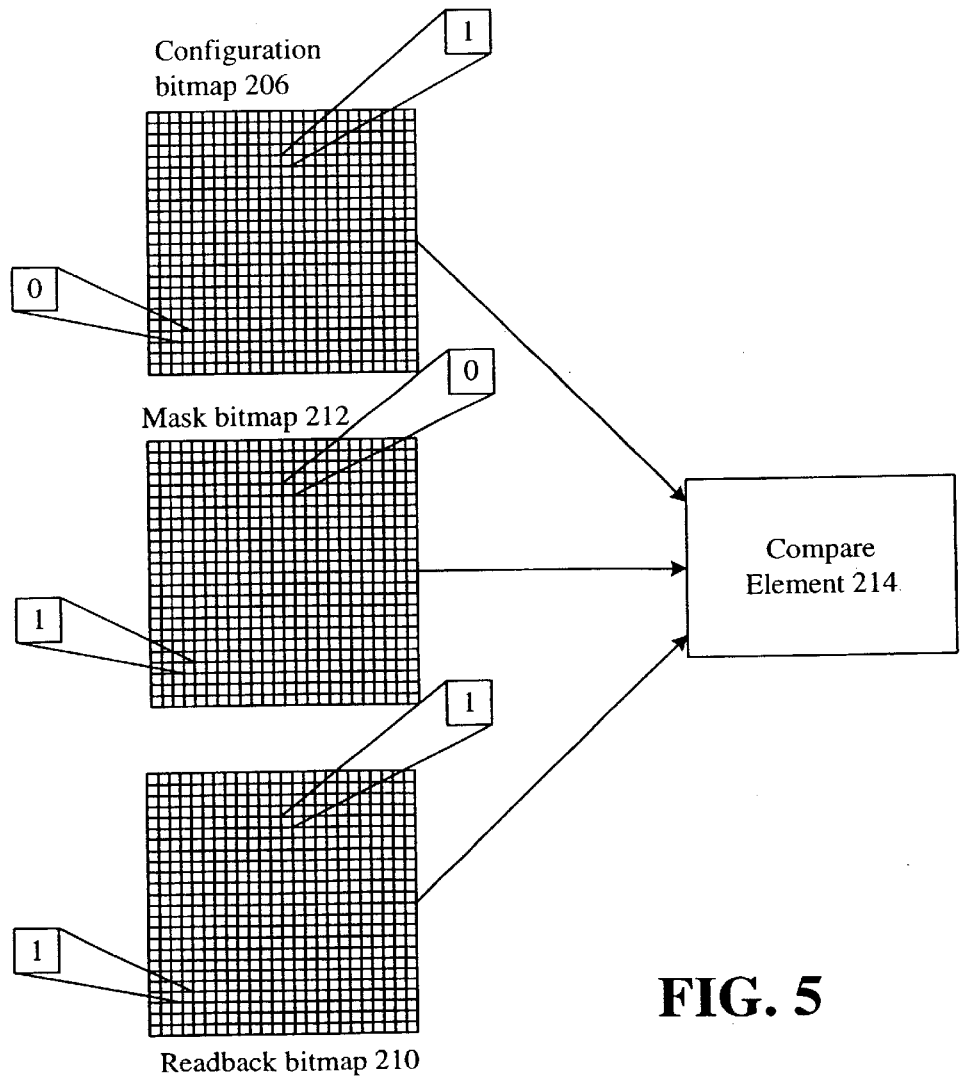
FIG. 5 illustrates the relationship between a configuration bitmap, a mask bitmap, and a readback bitmap.

FIG. 4 is a block diagram of the memory elements used to configure the programmable resources of a PLD, and FIG. 5 illustrates the relationship between configuration bitmap 206, mask bitmap 212, readback bitmap 210, and the memory elements used to configure the programmable resources of PLD 102. PLD 102 is shown as including an m×n array of memory elements (m rows and n columns) for configuring its programmable resources. Each of the memory elements is depicted as a cell within PLD 102. As previously mentioned, the memory elements of PLD 102 include configuration memory as well as non-configuration memory, such as user memory and storage elements (i.e., latches and flip-flops).

Each of configuration, mask, and readback bitmaps 206, 212, and 210 is an m×n array of cells that correspond to the memory elements of PLD 102. The bit values in the cells of configuration bitmap 206 indicate the anticipated state of the corresponding memory elements of PLD 102 after configuration is complete. The bit values in the cells of readback bitmap 210 indicate the actual state of the corresponding memory elements of PLD 102 after configuration is complete. In this embodiment, the bit values in the cells of mask bitmap 212 distinguish configuration memory cells from non-configuration memory cells.

The following examples further illustrate the operation of the present invention. Assume that the cells of the bitmaps are identified by row and column (e.g., cell 3,4 references the cell at row 3, column 4), a logic 1 in a cell of mask bitmap 212 identifies a non-configuration memory cell (in this embodiment, indicating that the bits in the corresponding cells of configuration bitmap 206 and readback bitmap 210 need not be compared), a logic 0 in a cell of mask bitmap 212 identifies a configuration memory cell (in this embodiment, indicating that the bits in the corresponding cells of configuration bitmap 206 and readback bitmap, 210 are compared). If cell 5,13 of configuration bitmap 206 is logic level 1, cell 5,13 of mask bitmap 212 is logic level 0, and cell 5,13 of readback bitmap, 210 is logic level 1, then cell 5,13 of configuration bitmap 206 is compared to cell 5,13 of readback bitmap 210. Since the values in the cells are equal, the present invention verifies that cell 5,13 is properly configured. In contrast, if cell 21,4 of configuration bitmap 206 is logic level 0, cell 21,4 of mask bitmap 212 is logic level 1, and cell 21A of readback bitmap 210 is logic level 1, then cell 21,4 of configuration bitmap 206 is not compared to cell 21A of readback bitmap 210.

The present invention is believed to be applicable to a variety of programmable logic devices and has been found to be particularly applicable and beneficial in Xilinx FPGAs. While the present invention is not so limited, an appreciation of the present invention has been provided by way of specific examples involving FPGAS. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for verifying configuration of a programmable logic device (PLD), comprising:
   converting a configuration bitstream containing configuration commands and data to a configuration bitmap;
   downloading the configuration bitstream to the PLD;
   reading back data from the PLD;
   converting the data read back from the PLD to a readback bitmap;
   comparing bit values in the readback bitmap to corresponding bit values in the configuration bitmap; and
   providing an error signal if at least one bit value in the readback bitmap does not equal a corresponding bit value in the configuration bitmap.

2. The method of claim 1, further comprising comparing only certain ones of the bit values of the readback bitmap and the configuration bitmap.

3. The method of claim 2, wherein the certain ones of the bit values are identified using a mask bitmap.

4. The method of claim 1, further comprising:
   accumulating a total number of bit values of the readback bitmap that are not equal to the corresponding bit values in the configuration bitmap; and
   outputting the total number.

5. The method of claim 1, further comprising:
   creating a mask bitmap having bit values indicating which bits of the readback bitmap are to be compared to the bits of the configuration bitmap; and
   selecting only certain ones of the bit values of the readback bitmap to compare to corresponding bit values in the configuration bitmap in response to corresponding bit values in the mask bitmap.

6. The method of claim 1, further comprising:
   providing an address to the PLD from which to begin reading back data; and
   writing the data read back from the PLD to locations in the readback bitmap beginning at a bitmap location associated with the address.

7. The method of claim 1, further comprising:
   interpreting the configuration commands; and
   writing bit values at selected locations in the configuration bitmap in response to the interpreted commands and the configuration data in the configuration bitstream.

8. The method of claim 1, further comprising:
   downloading readback commands to the PLD;
   prefixing the data read back from the PLD with the readback commands;
   interpreting the readback commands; and
   writing bit values at selected locations in the readback bitmap in response to the interpreted readback commands and the data read back from the PLD.

9. An apparatus for verifying configuration of a programmable logic device (PLD), comprising:
   means for converting a configuration bitstream containing configuration commands and data to a configuration bitmap;
   means for downloading the configuration bitstream to the PLD;
   means for reading back data from the PLD;
   means for converting the data read back from the PLD to a readback bitmap;
   means for determining whether bit values in the readback bitmap are equal to the corresponding bit values in the configuration bitmap; and means for providing an error signal if a bit value in the readback bitmap does not equal a corresponding bit value in the configuration bitmap.

10. A system for verifying configuration of a programmable logic device (PLD), comprising:

a host data processing system configured and arranged to convert a configuration bitstream containing configuration commands and data to a configuration bitmap, download the configuration bitstream to the PLD, read back data from the PLD, determine whether bit values in the readback bitmap are equal to corresponding bit values in the configuration bitmap, provide an error signal if a bit value in the readback bitmap does not equal a corresponding bit value in the configuration bitmap; and an interface device coupled to the host and arranged to be coupled to the PLD.

11. The system of claim 10, wherein the host is further configured and arranged to create a mask bitmap having bit values indicating which bits of the readback bitmap are to be compared to the bits of the configuration bitmap, select only certain ones of the bit values of the readback bitmap for comparison to corresponding bit values in the configuration bitmap in response to corresponding bit values in the mask bitmap.

12. The system of claim 10, wherein the host is further configured and arranged to provide an address to the PLD from which to begin reading back data and write the data read back from the PLD to locations in the readback bitmap beginning at the bitmap location associated with the address.

13. The system of claim 10, wherein the host is further configured and arranged to interpret commands and write bit values at selected locations in the configuration bitmap in response to the interpreted commands and the configuration data in the configuration bitstream.

14. The system of claim 10, wherein the host is further configured and arranged to download readback commands to the PLD, prefix and data read back from the PLD with the readback commands, interpret the readback commands, and write back bit values at selected locations in the readback bitmap in response to the interpreted readback commands and the data read back from the PLD.

* * * * *

UNITED STATES PATENT AND TRADEMARK OFFICE
CERTIFICATE OF CORRECTION

| | | |
|---|---|---|
| PATENT NO. | : 6,553,523 B1 | Page 1 of 1 |
| APPLICATION NO. | : 09/374251 | |
| DATED | : April 22, 2003 | |
| INVENTOR(S) | : Lindholm et al. | |

It is certified that error appears in the above-identified patent and that said Letters Patent is hereby corrected as shown below:

On the Title Page insert Item -- (73) Assignee: Xilinx, Inc., San Jose, CA (US) --.

Signed and Sealed this

Ninth Day of March, 2010

David J. Kappos
*Director of the United States Patent and Trademark Office*